United States Patent [19]

Smith

[11] Patent Number: 5,159,340
[45] Date of Patent: Oct. 27, 1992

[54] SIGNAL DIGITIZER FOR BAR CODE READERS

[75] Inventor: George E. Smith, Orosi, Calif.

[73] Assignee: Hewlett-Packard Company, Palo Alto, Calif.

[21] Appl. No.: 575,600

[22] Filed: Aug. 31, 1990

[51] Int. Cl.$^5$ ............... H03M 1/00; H03K 5/153; G06K 7/10

[52] U.S. Cl. ............... 341/132; 235/463; 307/351; 307/358

[58] Field of Search ............ 341/132; 307/351, 354, 307/358; 235/463

[56] References Cited

U.S. PATENT DOCUMENTS

| | | | |
|---|---|---|---|
| 4,219,152 | 8/1980 | Couch et al. | 235/463 |
| 4,517,455 | 5/1985 | Benitez, III et al. | 235/463 |
| 4,634,895 | 1/1987 | Luong | 307/350 |
| 4,827,191 | 5/1989 | Chapman | 341/132 |
| 4,965,782 | 10/1990 | Mathews | 369/48 |
| 5,003,196 | 3/1991 | Kawaguchi | 307/290 |
| 5,025,251 | 6/1991 | Mittel et al. | 340/825.44 |

*Primary Examiner*—Marc Hoff

[57] ABSTRACT

A signal digitizer for digitizing a continuous time varying input signal has a positive peak detector coupled to the input signal for storing the most positive peak value of the input signal and a negative peak detector coupled to the input signal for storing the most negative peak value of the input signal. Divider means are coupled to the outputs of the positive and negative peak detectors for producing a threshold voltage representative of a voltage between the outputs of the positive and negative peak detectors. A comparator has its inputs coupled to the threshold voltage and the input signal for producing a binary output signal in response to the relative values of its inputs. Limiter means are coupled to the outputs of the peak detectors for maintaining a maximum voltage potential between the peak detectors. Separator means are coupled to the outputs of the peak detectors for maintaining a minimum potential between the peak detectors regardless of the amplitude of the input signal.

18 Claims, 2 Drawing Sheets

SIGNAL DIGITIZER FOR BAR CODE READERS

FIELD OF THE INVENTION

This invention relates generally to the field of data converters, and, more particularly, to an analog signal digitizer for reading bar codes.

BACKGROUND OF THE INVENTION

Data converters are used, in the general sense, to convert data in one format to another format such as converting data in a continuous format to data in a discrete format while preserving enough information so that the discrete data are useful. A continuous time varying signal has a unique amplitude value for every instant in time. When that signal is quantized to form a discrete signal, a range of time values are assigned a common amplitude. Thus, some amplitude and time information is lost in the conversion process.

Obviously, for the digitization of a signal to be a desirable process, some information must also be preserved. Specifically, at the most basic level, the preserved information is the moment in time at which the amplitude of the input signal passes through the predetermined quantization levels of the converter. The amount of preserved information, or the resolution of the information, depends largely upon the specific application to which the conversion process is directed to. In audio applications, for example, the goal is to reconstruct the original input signal quantized by the converter. Thus, the resolution is relatively high. In other applications, the goal may not be to reconstruct the original signal, but merely to measure certain characteristics in the signal. For example, the time values at which the input signal transitions from one quantization level to another. Here, since the original signal does not have to be recreated, the resolution of the converter need only be high enough to satisfy the needs of the particular measurement.

As an example of a converter having a low resolution, assume that it is desired to measure the time values at which a sine wave, or quasi-sine wave, pass through ground potential (i.e. pass from positive to negative and from negative to positive). A common approach is to use a comparator (a specialized operational amplifier designed to compare two input voltages) which produces a binary signal (i.e., a two-level logic signal) in response to the relative values of the input voltages. Such a converter would have one of its inputs connected to ground, to provide a reference, and its other input connected to the input signal. The output of the comparator will be one binary value (for example, "LOW") when the input signal is more negative than the reference, and it will be another value (for example "HIGH") when the input signal is more positive than the reference.

As is often the case in measurement and instrumentation systems, the input signal is produced by taking an "electronic photograph" of a physical system. The analog signal produced (i.e. the input signal to the converter) is an approximation of the physical system. For example, an electrocardiogram is a electronic approximation of the electrical potential created by a beating heart. Similarly, in bar code readers, by passing a sensing wand over a bar code, an electronic approximation of the graphical representation of that bar code is formed. Thus, the analog signal, or input signal to the data converter, is the product of a conversion process itself; specifically, the conversion from a "physical system" format to an electronic format. This conversion produces abnormalities in the analog signal which must be compensated for in the data conversion process if the information originally existing in the physical system is to be properly interpreted.

Considerable reference will be made herein to printed bar code tags since they serve as a easily understandable example of problems encountered in data conversion devices. A bar code tag, such as the one shown in FIG. 1, uses a plurality of dark and light areas (bar code elements) to convey information. In the accepted convention, the dark areas are referred to as bars 11, and the light areas are referred to as spaces 12. Information is typically carried in the width of the bars as well as the width of the spaces. For example, FIG. 1 shows a bar code tag using the 3 of 9 alphanumeric code. Each character has five bars and four spaces, where each bar and space can have a value of zero (narrow) or one (wide). Therefore, errors in interpreting whether a particular code element if dark or light, as well as errors in interpreting where the boundary of an element exists will result in errors in reading the bar code. In addition to the characters, many bar code formats also have a margin area 14 adjacent to the ends of the bar code.

Bar code tags are scanned by moving a small spot of light across the bars and spaces. The output of the scanner is determined by the relative amounts of light that are reflected from the bars and spaces back into the scanner. It is this signal, the scanner output signal, which provides the input signal for the data converter. Generally, the pigmented portions of the bar code tag (the bars) reflect a low level of light while the non-pigmented portions (the spaces) reflect a relatively high level of light. The small size of the illuminated area make the scanner, and the data converter, more sensitive to printing flaws than the naked eye.

Bar code tags can be printed in a variety of ways and on a variety of media. The most commonly used media in industrial applications are adhesive labels, cards, and documents. However, tags are printed on other types of media, such as aluminum cans or plastic merchandising containers. Since the medium is an optical storage device, the optical characteristics of the medium affect the scanner output signal and, in turn, affect the requirements of the data converter. For example the surface reflectivity of the medium will affect the contrast between the medium (usually the spaces) and the ink (usually the bars) and thus affect the amplitude of the scanner output signal. The reflected radiation pattern will also affect the amplitude of the scanner output signal. For example, where the medium reflects light in a diffuse pattern, rather than a narrow pattern, the output signal of the scanner is less affected by large scan angles. The scan angle is the angle at which the bar code is scanned by the light emitting scanning device. At small scanning angles, the light tends to reflect back toward the scanner, while at large scanning angles the light tends to reflect away from the scanner.

The effectiveness of the bar code can also be affected by the printing process used. High print quality can be obtained by using lithographic, offset printing, ink jet, or other similar printing processes. Low print quality is often the result of dot matrix printing or poorly inked ribbons in drum or daisy wheel printing processes.

In bar code reader systems, as in other conversion systems, the data converter must be able to detect the level of the input signal, and the time values associated with the change of the input signal between levels. For example, assume that in a bar code system, the scanner scans a space followed by a bar followed by a space. The resulting output from the scanner will be an analog signal having a relatively higher value (corresponding to the large reflectivity of the space) followed by a relatively lower value followed by another relatively high value. The converter must be able to distinguish the lower values from the higher values and produce a binary signal having binary HIGHs and LOWs corresponding to the analog signal. The converter must also faithfully reproduce the pulse widths of the signal proportionately to the respective widths of the bar code tag's bars and spaces. This is important since most bar codes use the widths of the bars and spaces to convey information.

The zero crossing detector as described above would be substantially sufficient as a converter for a bar code reader system if the input signal always had a reference voltage equal to zero volts. However, since the relative values of the analog input signal can vary depending on the various optical characteristics of the bar code tags outlined above, more flexible circuits must be utilized to decode the input signal.

In the past, converter circuits for converting an analog signal into a one-bit binary signal have been of the delta detector type or the peak detector type. An example of a delta detector is shown in FIG. 2. The circuit comprises a comparator 16 having the input signal connected to one of its inputs (in FIG. 2, the input signal is connected to the non-inverting input to the comparator). The other input to the comparator is connected to one electrode of a capacitor 17, the other electrode of which is connected to ground. Two diodes 18, are connected, in opposite directions between the inputs of the comparator. The diodes and the capacitor provide a threshold voltage used to reference the analog input signal. Because of the diodes, the threshold voltage is never closer to the extreme values of the analog input signal than one diode drop. When the analog input signal has a relatively high value, then the threshold voltage changes to approach a value one diode drop below the value of the analog input signal. Since the non-inverting input of the comparator is higher than the inverting input, the output of the comparator is HIGH. When the analog input signal transitions to its lower level, the non-inverting input of the comparator falls below the threshold voltage, thus causing the comparator output to switch from HIGH to LOW. Also, the capacitor voltage begins to charge to a value of approximately one diode drop above the analog input signal. The rate at which the capacitor charges and discharges is controlled by the value of the capacitor.

FIG. 3 shows an exemplary prior art peak detector converter. Similarly to the delta detector, in the peak detector converter, the non-inverting input to a comparator is connected to the analog input signal. The inverting input of the comparator 19 is connected to the threshold voltage 21. However, in this circuit, the threshold voltage is provided by a voltage divider connected between the outputs of a pair of peak detectors, one a positive peak detector 22 and the other a negative peak detector 23. The positive peak detector stores the most positive value of the analog input signal while the negative peak detector stores the most negative value of the input signal. The threshold voltage is then derived by dividing the voltage between the outputs of the positive and negative peak detectors. Since the threshold voltage is generally between the peaks of the input signal, the output of the comparator will switch each time the analog input signal transitions between its higher and lower values.

Particular problems related to the measurement of any physical system can be visualized by reference to a few examples regarding bar codes. Similarly, the operation of the prior art converters described above can be described in more detail with reference to the same examples.

One aspect of measuring bar code tags involves the floating reference of the tag. In the zero-crossing detector example cited above the sine wave input has a reference of zero volts. Where the sine wave is created by a function generator or other electrical system having a known reference voltage, the value of the reference input to the comparator is easily determined. However, in the bar code shown in FIG. 1, only the extreme values of the code are known; the code is either black or it is white. There is no "gray" reference value with which to compare the black and white. Similarly, when the bar code is read by the electrical device, the signal is either high (usually indicating a space) or it is low (usually indicating a bar). The code itself does not provide a reference with which to judge when the signal transitions from low to high or from high to low. Rather, the converter must derive the appropriate reference point based on the input values.

A second characteristic of bar code tags which dictate the effectiveness of the data converter is the contrast of the tag, or, more specifically, the contrast between the bars and the spaces on the tag. A bar code tag having a high contrast will usually result in an analog input signal with large amplitude peak to peak values. However, for example, where the bars in a bar code are black and the spaces are dark gray, the input signal generated by reading the code will have a small peak to peak voltage. A similar result occurs where the spaces are white but the bars are gray. Low contrast bar code tags occur for various reasons. For example, the originally high contrast of a tag can be lowered where it is photocopied one or several times using low quality equipment. Also, low contrast tags occur when the tag is printed using colors. Some colors that are obviously different to the human eye (because light reflected from them have different wavelengths) do not appear to be different to an optical bar code reader (because the amplitude of the reflected light is similar). This phenomenon occurs, for example, where brown bars are printed on a yellow background. The contrast of originally high contrast tags can also be diminished by exposure to "the elements" such as sunlight, water or other elements which may coat or smear the tag.

Delta detector type converters typically cannot decode a signal created by scanning a low contrast tag. Because of the low contrast, the peak to peak voltage of the analog input signal is small. However, the delta detector converter requires the peak to peak voltage to be approximately equal to two forward voltage diode drops. In other words, the input signal must be larger than the voltage drop across the diode or the diodes will not conduct, and the threshold voltage will not adjust accordingly.

Other defects in the printed tags can result in amplitude modulation of the derived input signal. For example, low frequency modulation occurs where the peak values of the input signal vary over the length of the scan. Low frequency modulation can occur under varying conditions. For example, where the print quality of the tag varies over the length of the bar code the result will be an analog input signal which varies in amplitude. Typically this problem is caused by smearing or fading of a portion of the tag or by a poor printing process, such as printing with a ribbon which has a poorly inked area on it. Here, one portion of the tag may have a high contrast, while another portion of the tag may have a low contrast. Another common cause of low frequency amplitude modulation is what is commonly referred to as roll angle error. Roll angle error is caused by varying the angle with which the optical scanner scans the bar code tag. This often occurs when a person is responsible for providing the scanning mechanism since it is generally unnatural for a person to move their arm or hand in a precisely linear fashion. Some systems require a person to scan a stationary bar code tag with a light wand. Other systems require the person to move the bar code tag in relation to a stationary optical sensor.

When a peak detector type converter is used in scanning a tag with varying contrasts, the converter has a tendency to distort the true pulse widths of the analog signal. This occurs because once the peak detectors are set, their values do not change appreciably during scanning. Since the threshold voltage is determined according to the values of the peak detectors, it too may not change in response to the changing peak values of the input signal. If the threshold voltage is too far from the center of the peaks of the input signal, the pulse widths of the resultant comparator output will be distorted.

High frequency amplitude modulation, or in other words noise, can appear on the input signal derived from scanning tags having poor graphic resolution. This often occurs on bar code tags printed with a dot matrix printer. These poorly printed tags may contain small white areas within the boundaries of a bar or small black areas within the boundaries of a space. Although the eye can easily tell what the bar code is supposed to be, regardless of the impurities, the bar code reader has a more difficult problem of it. This is because the eye has the benefit of the entire lateral dimension of the bar code to determine the values of the bars and spaces. On the other hand, the bar code reader takes a one-dimensional slice along the longitudinal dimension of the tag. Thus when a light space is encountered, the reader cannot tell whether it is an impurity within a bar, or whether it is the beginning of a space.

Another source of noise is called white paper noise. In the peak detector converter shown in FIG. 3, when the scanner is placed on white paper, for example in the margin next to the bar code, the peak detectors tend to converge to the same value since the capacitors in each peak detector are allowed to discharge. Movement of the scanner along the white paper will result in small amplitude signals being input into the converter circuit. Since the threshold is now so close to the "white" peak, small impurities, even those invisible to the naked eye, will trigger the comparator. If these pulses occur within ten elements of the first bar of the tag, the decoder may create an error.

SUMMARY OF THE INVENTION

The present invention provides a signal digitizer for digitizing a continuous time varying input signal having values positive and negative of an internally compensated threshold voltage. The signal digitizer comprises a positive peak detector coupled to the input signal for storing the most positive peak value of the input signal and a negative peak detector coupled to the input signal for storing the most negative peak value of the input signal. Divider means are coupled to the outputs of the positive and negative peak detectors for producing a threshold voltage representative of a voltage between the outputs of the positive and negative peak detectors. In one embodiment the threshold voltage represents the average value of the two peak detectors.

A comparator has its inputs coupled to the threshold voltage and the input signal for producing a binary output signal in response to the relative values of its inputs. The output of the comparator is one binary value when the input signal is more positive than the threshold voltage and a different binary value when the input signal is more negative than the threshold voltage. Limiter means are coupled to the outputs of the peak detectors for maintaining a maximum voltage potential between the peak detectors. The limiter means allows the positive peak detector to update its stored value while the negative peak detector is storing the value of the negative peak of the input signal and which allows the negative peak detector to update its stored value while the positive peak detector is storing the value of the positive peak of the input signal. In one embodiment of the present invention, the digitizer also comprises separator means coupled to the outputs of the peak detectors for maintaining a minimum potential between the peak detectors regardless of the amplitude of the input signal.

DETAILED DESCRIPTION

Figure 1:
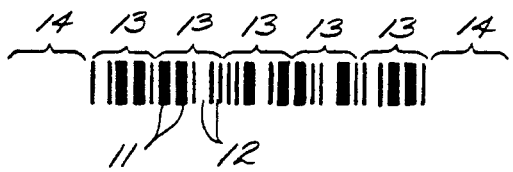
FIG. 1 illustrates an exemplary bar code tag.
Figure 2:
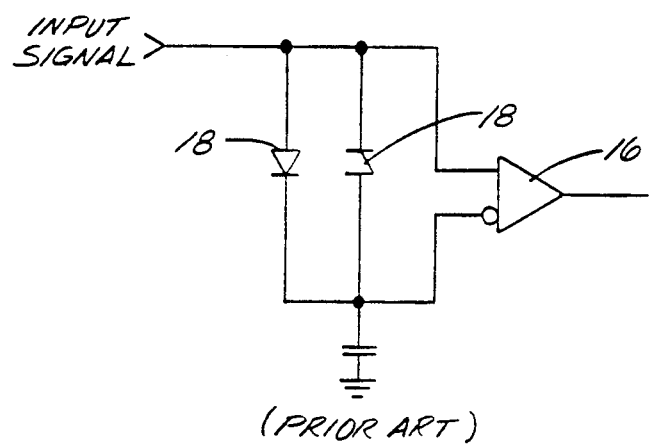
FIG. 2 is a schematic of a prior art delta detector type converter circuit.
Figure 3:
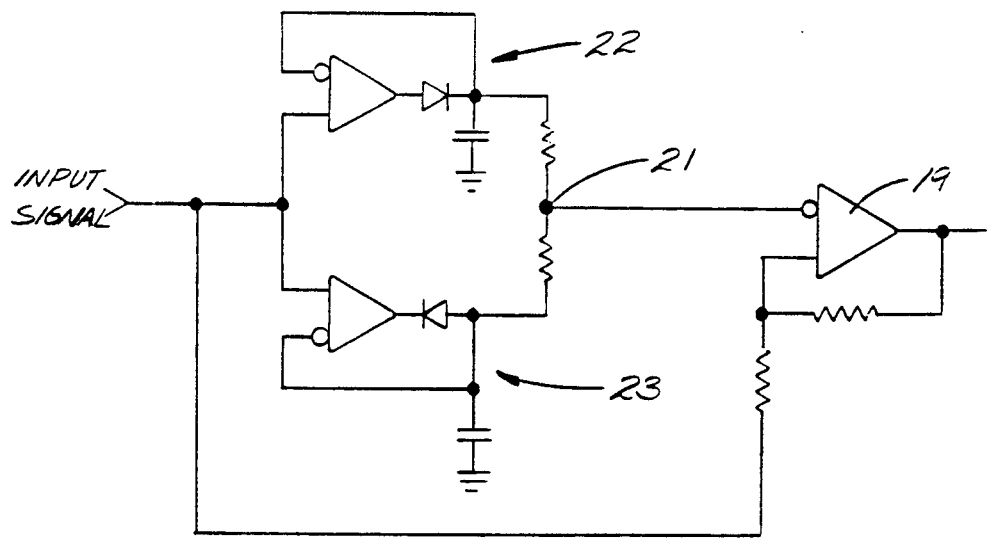
FIG. 3 is a schematic of a prior art peak detector type converter circuit.
Figure 4:
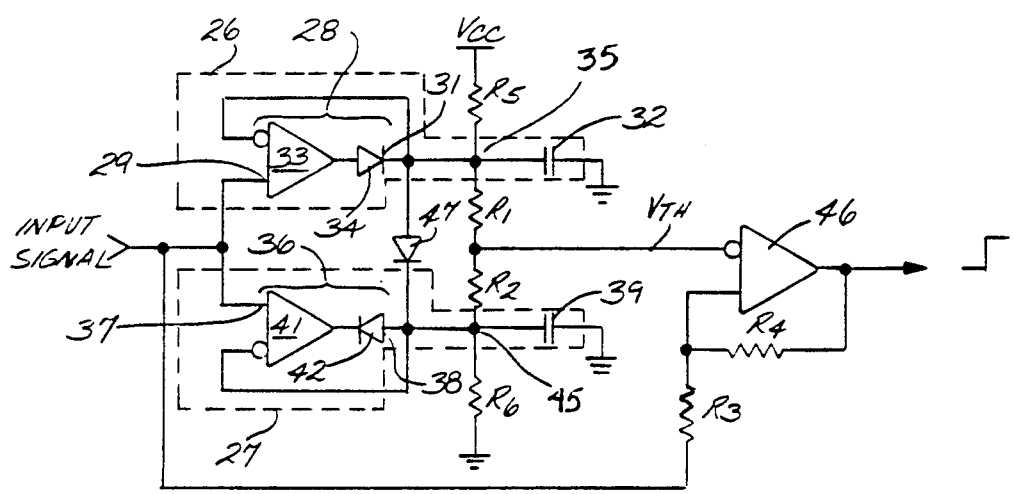
FIG. 4 is a schematic representation of the signal detector of the present invention.

Referring to FIG. 4, the signal detector of the present invention comprises a positive peak detector 26 and a negative peak detector 27. The positive peak detector stores the most positive value of a continuous time varying analog input signal connected to its input. Conversely, the negative peak detector stores the most negative value of the analog input signal. It should be understood that the input signal does not have to pass below zero volts to activate the negative peak detector. Instead, the negative peak detector is set at the most negative voltage of the input signal relative to the most positive value.

The positive peak detector comprises a first precision diode 28 having an anode 29 connected to the analog input signal and an cathode 31 connected to one electrode of a first storage capacitor 32. The other electrode of the first storage capacitor is connected to ground. The output of the positive peak detector, shown at reference numeral 35 in FIG. 4, is the voltage across the first storage capacitor 32. The precision diode comprises a first operational amplifier 33 connected in series with a first conventional signal diode 34. Specifically, the output of the first operational amplifier is connected to the anode of the first signal diode, and the cathode of the first signal diode is connected to the inverting input of the first operational amplifier. The first operational amplifier and the first signal diode together make up the first precision diode wherein the anode 29 of the precision diode is the non-inverting input of the first operational amplifier 33 and the cathode 31 of the precision diode is at the cathode of the first signal diode 34.

The function of the first precision diode is similar to a conventional signal diode. Specifically, the precision diode will conduct current when it is forward biased and it will block current when reverse biased. However, where a biasing of several tenths of a volt is required to forward bias a signal diode, the gain of the operational amplifier 33 (connected with feedback from the output of the signal diode 34) reduces the forward bias needed to activate the precision diode by a factor approximately equal to the gain of the operational amplifier.

In operation, the precision diode will allow the first storage capacitor to charge to the most positive amplitude value of the input signal. Ignoring, for the moment, the effect of the other circuit components, the storage capacitor will remain charged at this value since the precision diode will block current in the reverse direction. The voltage potential across the first storage capacitor will only change in response to a larger positive going amplitude of the input signal.

The only time during which it is possible to charge the first storage capacitor is when the input signal has a positive slope (i.e. when the input signal is getting larger). Further, the voltage stored in the capacitor is only updated when the positive slope of the input signal takes the input signal to a higher potential than the stored voltage. For example, assuming the input signal has a first positive peak of one volt, the first storage capacitor 32 will charge to one volt as the input signal rises to this voltage level. As the input signal falls to its minimum level, the capacitor will remain charged to one volt since the first precision diode 28 in the positive peak detector blocks current in the reverse direction. As long as the capacitor remains charged to the maximum peak value of the input signal, it cannot discharge while the input signal is falling to its minimum level (that is, while the input signal has a negative slope).

The negative peak detector 27 comprises a second precision diode 36 having a cathode 37 connected to the analog input signal and an anode 38 connected to one electrode of a second storage capacitor 39. The other electrode of the second storage capacitor is connected to ground. The output 45 of the negative peak detector is the voltage across the second storage capacitor 39. The second precision diode comprises an second operational amplifier 41 connected to a second conventional signal diode 42. However, in the negative peak detector, the output of the second operational amplifier is connected to the cathode of the second signal diode and the anode of the second signal diode is connected to the inverting input of the second operational amplifier.

The negative peak detector operates in a similar manner as the positive peak detector except that the second storage capacitor is charged to the most negative, or lowest, peak of the input signal. Ignoring the other circuit components, the voltage across the second storage capacitor will change only in response to a more negative peak of the input signal.

In contrast to the positive peak detector, the only time during which it is possible to charge the second storage capacitor is when the input signal has a negative slope and when the input signal is smaller than the value stored in the capacitor.

In reality the first and second storage capacitors will discharge if the value to which they are charged is not maintained at their non-grounded terminal. The capacitors will discharge through leakage current in the capacitors and through circuit resistors to ground. However, the time constant of the capacitor discharge circuit is selected to be large enough so that the capacitors will not discharge appreciably in the time between the peaks of the input signal. The decay time of the capacitors is selected as a compromise between the possible frequencies of the input signal. In a bar code scanning system, a person often controls the speed of the scan. Thus, the speed of the scan can vary over the range from 2 inches per second to 50 inches per second (approximately 5 cm/sec to 127 cm/sec). Typical scan speeds are approximately 20 inches per second (approximately 51 cm/sec). In an exemplary embodiment, typical values for the first and second storage capacitors are 0.1 microfarads.

A voltage divider is connected across the peak detectors 26 and 27 to provide a threshold voltage $V_{TH}$. The voltage divider comprises a first threshold resistor R1 connected in series with a second threshold resistor R2 between the output 35 of the positive peak detector and the output 45 of the negative peak detector. The threshold voltage appears at the center tap of the voltage divider and is connected to the inverting input of a comparator 46. The non-inverting input of the comparator is connected to the input signal through a series resistor R3 and to the output of the comparator through a feedback resistor R4. The series resistor and the feedback resistor provide hysteresis for the comparator function.

The comparator switches between binary values, i.e. LOW and HIGH, according to the relative values of the comparator's inputs. When the non-inverting input is more positive than the inverting input, the comparator output is HIGH. When the non-inverting input is more negative than the inverting input, the comparator output is LOW. Thus, when the input signal is more positive than the threshold voltage, the comparator will output a HIGH signal, and when the input signal is more negative than the threshold voltage, the comparator will output a LOW signal.

Applying this circuit in a bar code reading system, when a space in the bar code tag is scanned, the input signal rises to a relatively higher amplitude and when a bar is scanned, the input signal drops to a relatively lower amplitude. The positive peak detector is automatically set to a value equal to the high amplitude point in the input signal and the negative peak detector is automatically set to a value equal to the low amplitude point in the input signal. Assuming that the positive and negative values of the input signal do not become more positive and negative respectively after the first bar and space are scanned, the values of the peak detectors will be set by the first elements scanned. Similarly, the threshold voltage will also be set by the first elements scanned. This is satisfactory in an ideal system where the contrast of the bar code tag is consistent along its length, and thus, the high and low amplitude values of the input signal remain the same for each bar and space scanned. However, where inconsistencies occur in the input signal, caused, for example, by varying contrast of the tag or by roll angle error, the threshold voltage may be offset from the desired reference voltage for the input signal.

To prevent this from happening, a clamping diode 47 is connected between the outputs of the peak detectors. Specifically, the anode of the clamping diode is connected to the output 35 of the positive peak detector and the cathode of the clamping diode is connected to the output 45 of the negative peak detector. The clamping diode ensures that the values of the peak detectors never stray more than the forward voltage drop of the clamping diode. In an exemplary embodiment, a silicon diode is used. Thus, the maximum voltage potential between the peak detectors is approximately 600 mV.

The function of the clamping diode is best understood by way of example. Assume that the bar code to be scanned has black bars printed on a white medium. The medium maintains consistent reflective properties throughout the tag, however, the bars are dark near the beginning of the tag and gradually lighten to a gray tone by the end of the tag. Thus when scanning the tag, the spaces produce a consistent high amplitude peak in the input signal. However, the bars initially produce a low amplitude peak, and as the tag is scanned, the peak values corresponding to the bars gradually rise. When using a peak detector type data converter not having the clamping diode 47, the threshold voltage, being set by the first bar and space encountered by the scanner, is the same value for the entire scan. Therefore, the threshold voltage is properly set for the first part of the tag (the high contrast part) but not for the later part of the tag (the part having a lower contrast). Specifically, since the average value of the input signal rises, due to the increased reflection of the gray bars, the set threshold voltage is too low for converting the scan of the low contrast portion of the tag. This results in pulse width distortion of the output signal.

In the circuit of the present invention, the clamping diode 47 allows the threshold voltage to move in response to a change in the peak values of the input signal. More specifically, the clamping diode ensures that the threshold voltage is always within one forward voltage drop of the input signal. When the scanner encounters a bar, the negative peak detector is set at a value equal to the amplitude of the input signal. However, if the peak to peak amplitude of the input signal is greater than the forward voltage drop across the clamping diode, the positive peak detector will follow the negative peak detector. Thus, the negative peak detector will be set at a value equal to the negative going peak of the input signal, the positive peak detector will be set at a value equal to one diode drop above the negative peak detector and the threshold voltage will be set at a value between the peak detectors. When a space is encountered by the scanner, the positive peak detector is set to the value of the positive peak of the input signal, the negative peak detector follows and is set to a value equal to one diode drop below the positive peak detector and again, the threshold voltage is set to a value between the peak detectors.

It should be understood that where the input signal is large enough to bring the clamping diode into play, the threshold voltage varies with the peaks of the input signal. This has the effect of maintaining a constant phase relationship between the input signal and the output of the comparator. In the prior art peak detector type of converter, the phase relationship is maintained for signals having uniform peak levels since the threshold voltage is maintained at a specified distance from the peak amplitudes of the input signal, namely the average amplitude of the input signal. However, when the amplitude of the input signal is modulated this relationship is no longer maintained since the threshold voltage may be closer to one amplitude peak than the other. In the present invention, the threshold voltage is maintained at a specified distance from the peak amplitudes of the input signal, i.e., one forward diode drop from the peak value, regardless of the amplitude modulation of the input signal.

The voltage divider between the peak detectors offers flexibility in setting the threshold at any fraction between the peak values of the input signal. For example, it has been demonstrated that the present invention operates best with high contrast, high quality bar code tags when the threshold voltage is set at 40% of the potential between the peak detectors, measured from the negative peak detector. Alternatively, the circuit operates best with tags printed with a dot matrix printer when the threshold voltage is set to equal 60% of the potential between the peak detectors. Exemplary values for the divider resistors R1 and R2 are 330 and 470 K ohms.

The circuit of the present invention also comprises a pull-up resistor R5 connected between the output 35 of the positive peak detector 26 and $V_{CC}$ and a pull-down resistor R6 connected between the output 45 of the negative peak detector 27 and ground. In an exemplary embodiment of the present invention, the value of the pull-up resistor is selected to be approximately 6.8 M ohms and the value of the pull-down resistor is selected to be approximately 1.3 M ohms The pull-up and pull-down resistors R5 and R6 respectively separate the peak detectors when the input signal is small. In an exemplary embodiment, the values of the pull-up and pull-down resistors are selected to maintain at least a 100 mV potential between the peak detectors. This in turn prevents the converter from digitizing small noise signals on a low amplitude input signal such as white paper noise.

White paper noise results from allowing the peak detectors to converge to the same potential. Once this occurs, even the smallest noise signals will trigger the comparator since the threshold voltage is nearly the same as the value of the input signal. Peak detectors connected together by a voltage divider tend to converge to a common potential when the input signal is flat. This occurs because the storage capacitors are allowed to discharge completely to the level of the input signal. This is particularly a problem in reading bar code tags since the tag typically has a white margin at the beginning of the bar code. Small impurities and shadows in the margin, although not visible to the eye, produce small signals in the scanner as the scanner begins to scan the bar code. These signals are then digitized by the converter, thus resulting in an error in reading the bar code.

In the present invention, the pull-up and pull-down resistors R5 and R6 pull the peak detectors apart to prevent the converter from digitizing these signals. A compromise must be reached as to the potential to which these resistors separate the peak detectors since too small a potential will result in the digitizing of noise signals and too large a potential will result in the inability of the circuit to digitize input signals having low peak to peak amplitudes (such as signals produced by scanning a low contrast tag.) In an exemplary embodiment, values for the pull-up and pull-down resistors are selected to provide a minimum separation between the peak detectors of 100 to 300 mV.

The preceding description has been presented with reference to the presently preferred embodiment to the invention shown in the drawings. Those skilled in the art and technology to which this invention pertains will appreciate that alterations and changes in the described structures can be practiced without departing from the spirit, principles and scope of this invention.

For example, it is apparent that other means for separating the peak detectors can be utilized. For example, current sources can replace the pull-up and pull-down resistors described in the embodiment shown in the drawings.

Further, it should be obvious that the present invention can be used in data conversion systems other than bar code readers. The embodiment described is an analog-to-digital converter which transforms a continuous time varying input signal into a one-bit binary signal. The circuit compensates for high and low frequency amplitude modulation in the input signal and it is capable of operating with high or low peak to peak amplitude input signals.

Accordingly, the foregoing description should not be read as pertaining only to the precise structure described, but rather should be read consistent with, and as support for, the following claims which are to have their fullest fair scope.

What is claimed is:

1. A signal digitizer for digitizing a continuous time varying input signal having values positive and negative of a reference level, the signal digitizer comprising:
   a positive peak detector coupled to the input signal for storing the most positive peak value of the input signal;
   a negative peak detector coupled to the input signal for storing the most negative peak value of the input signal;
   divider means coupled to the positive and negative peak detectors for producing a threshold voltage representative of a voltage between the outputs of the positive and negative peak detectors;
   means for comparing the threshold voltage to the input signal and for producing one binary value when the input signal is more positive than the threshold voltage and a different binary value when the input signal is more negative than the threshold voltage; and
   limiter means coupled to the outputs of the peak detectors for maintaining a maximum voltage potential between the peak detectors.

2. A signal digitizer as recited in claim 1 wherein the limiter means comprises means for allowing the positive peak detector to update the its stored value while the negative peak detector is storing the value of the negative peak of the input signal and allowing the negative peak detector to update its stored value while the positive peak detector is storing the value of the positive peak of the input signal.

3. A signal digitizer as recited in claim 1 wherein the limiter means comprises a clamping diode.

4. A signal digitizer as recited in claim 3 wherein the positive peak detector comprises a capacitor that is charged to the value of the most positive peak of the input signal during the positive cycle of the input signal and is capable of being discharged through the clamping diode during the negative cycle of the input signal.

5. A signal digitizer as recited in claim 4 wherein the negative peak detector comprises a capacitor that is charged to the value of the most negative peak of the input signal during the negative cycle of the input signal and is capable of being discharged through the clamping diode during the positive cycle of the input signal.

6. A signal digitizer as recited in claim 1 further comprising means coupled to the outputs of the peak detectors for maintaining a minimum voltage potential between the peak detectors regardless of the peak to peak amplitude of the input signal.

7. A level detector for digitizing a continuous time varying input signal comprising:
   a positive peak detector coupled to the input signal;
   a negative peak detector coupled to the input signal;
   divider means coupled to the positive and negative peak detectors for producing a threshold voltage representative of a voltage between the outputs of the positive and negative peak detectors;
   means for comparing the threshold voltage to the input signal and for producing one binary value when the input signal is more positive than the threshold voltage and a different binary value when the input signal is more negative than the threshold voltage; and
   separator means coupled to the outputs of the peak detectors for maintaining a minimum potential between the peak detectors regardless of the amplitude of the input signal.

8. A level detector as recited in claim 7 wherein the separator means comprises:
   a pull-up resistor connected between the output of the positive peak detector and a supply voltage; and
   a pull-down resistor connected between the output of the negative peak detector and ground.

9. A level detector as recited in claim 7 wherein the separator means maintains at least a 100 mV potential between the outputs of the positive and negative peak detectors.

10. A level detector as recited in claim 7 wherein the separator means comprises a first current source connected to the output of the positive peak detector and a second current source connected to the negative peak detector.

11. A level detector as recited in claim 7 comprising limiter means coupled to the outputs of the peak detectors for maintaining a maximum voltage potential between the peak detectors.

12. A data converter for digitizing a continuous time varying input signal comprising:
   positive detector means for storing the value of the input signal, the positive detector means independently updating the stored value only when the input signal has a positive slope;
   negative detector means for storing the value of the input signal, the negative detector means independently updating the stored value only when the input signal has a negative slope;
   clamping means coupled to the positive detector means and the negative detector means for maintaining a specified maximum potential between the positive and negative detector means, the clamping means dependently updating the stored value of the negative detector when the input signal has a positive slope and the clamping means dependently updating the stored value of the positive detector when the input signal has a negative slope;
   divider means coupled to the positive and negative detector means for providing a threshold voltage; and comparator means coupled to the input signal and the threshold voltage for providing a binary signal, the value of the binary signal being dependent upon the relative potentials of the input signal and the threshold voltage.

13. A data converter as recited in claim 12 wherein the clamping means comprises a diode connected between the output of the positive detector means and the negative detector means.

14. A data converter as recited in claim 13 wherein the diode has a forward bias voltage substantially equal to the specified maximum potential to be maintained between the positive and negative detector means.

15. An analog-to-digital converter for converting an analog signal to a discrete signal, the converter comprising:
- a positive peak detector coupled to the input signal for storing the most recent highest peak value of the input signal;
- a negative peak detector coupled to the input signal for storing the most recent lowest peak value of the input signal;
- clamping means for limiting the maximum potential between the positive peak detector and the negative peak detector to a first selected level;
- separator means for limiting the minimum potential between the positive peak detector and the negative peak detector to a second selected level;
- divider means coupled to the positive and negative peak detectors for producing a threshold voltage have a potential between the voltage potentials of the positive peak detector and the negative peak detector; and
- means for comparing the threshold voltage to the input signal and for producing one binary value when the input signal is more positive than the threshold voltage and a different binary value when the input signal is more negative than the threshold voltage.

16. A one-bit analog-to-digital converter comprising:
- a first precision diode having an anode and a cathode, the anode being connected to the input signal;
- a second precision diode having an anode and a cathode, the cathode being connected to the input signal;
- a first storage capacitor coupled to the cathode of the first precision diode;
- a second storage capacitor coupled to the anode of the second precision diode;
- a resistive voltage divider connected between the cathode of the first precision diode and the anode of the second precision diode, the voltage divider having an output representative of a voltage potential between the voltage potentials at the outputs of the precision diodes;
- a pull-down resistor connected between the anode of the second precision diode and ground;
- a pull-up resistor connected between the cathode of the first precision diode and a positive power supply;
- a clamping diode having an anode connected to the cathode of the first precision diode and a cathode connected to the anode of the second precision diode; and
- a comparator having one input connected to the output of the voltage divider and the other input connected to the input signal, the output of the comparator providing a binary signal representative of the potential of the input signal relative to the threshold voltage.

17. A level detector as recited in claim 16 wherein the first precision diode comprises:
- a diode having an anode and a cathode; and
- an operational amplifier having its inverting input connected to the cathode of the diode, the inverting input being the cathode of the precision diode and the non-inverting input being the anode of the precision diode.

18. A level detector as recited in claim 17 wherein the second precision diode comprises:
- a diode having an anode and a cathode; and
- an operational amplifier having its inverting input connected to the anode of the diode, the non-inverting input being the cathode of the precision diode and the inverting input being the anode of the precision diode.

* * * * *